(12) United States Patent
Venkatesan et al.

(10) Patent No.: US 11,264,567 B2
(45) Date of Patent: Mar. 1, 2022

(54) MEMORY DEVICE WITH INCREASED ELECTRODE RESISTANCE TO REDUCE TRANSIENT SELECTION CURRENT

(71) Applicant: INTEL CORPORATION, Santa Clara, CA (US)

(72) Inventors: Srivatsan Venkatesan, Sandy, UT (US); Davide Mantegazza, Palo Alto, CA (US); John Gorman, San Jose, CA (US); Iniyan Soundappa Elango, Lehi, UT (US); Davide Fugazza, San Jose, CA (US); Andrea Redaelli, Milan (IT); Fabio Pellizzer, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 16/688,309

(22) Filed: Nov. 19, 2019

(65) Prior Publication Data
US 2021/0151672 A1    May 20, 2021

(51) Int. Cl.
*H01L 45/00*     (2006.01)
*H01L 27/24*     (2006.01)

(52) U.S. Cl.
CPC ...... *H01L 45/1253* (2013.01); *H01L 27/2409* (2013.01); *H01L 27/2463* (2013.01); *H01L 45/06* (2013.01); *H01L 45/1233* (2013.01); *H01L 45/1608* (2013.01); *H01L 45/144* (2013.01)

(58) Field of Classification Search
CPC ............. H01L 45/1253; H01L 45/1608; H01L 27/2463; H01L 27/2409; H01L 45/06; H01L 45/1233; H01L 45/144
See application file for complete search history.

(56) References Cited

U.S. PATENT DOCUMENTS

| 2008/0055969 | A1* | 3/2008 | Liu | H01L 45/16 365/163 |
| 2013/0187110 | A1* | 7/2013 | Tendulkar | H01L 45/08 257/2 |

(Continued)

OTHER PUBLICATIONS

CRC Materials Science and Engineering Handbook 4th Edition, Shackelford J.F. et al., CRC Press, 2016 (Year: 2016).*

*Primary Examiner* — Jerome Leboeuf
(74) *Attorney, Agent, or Firm* — Compass IP Law PC

(57) ABSTRACT

Various embodiments of a three-dimensional cross-point (3D X-point) memory cell design include one or more electrodes having an increased resistance compared to existing memory cell designs or compared to other electrodes within a same memory cell. A memory device includes an array of memory cells with each memory cell arranged between a word line and a bit line of the memory device. Some embodiments include additional material layers to increase memory cell resistance. Some embodiments include electrodes having an increased thickness to increase the resistance. Some embodiments include electrodes having a composition with a higher resistivity. Some embodiments include electrodes with increased interface resistance. Some embodiments include a combination of such features. In any case, the resulting increased memory cell resistance causes a reduction in the transient selection current for the given memory cell.

5 Claims, 14 Drawing Sheets

(56) References Cited

U.S. PATENT DOCUMENTS

| | | | |
|---|---|---|---|
| 2014/0264239 A1* | 9/2014 | Ananthan | H01L 22/34 257/4 |
| 2015/0123066 A1* | 5/2015 | Gealy | H01L 45/1253 257/4 |
| 2016/0149128 A1* | 5/2016 | Bodke | H01L 45/149 257/4 |
| 2017/0236584 A1* | 8/2017 | Allegra | G11C 11/5678 365/163 |

* cited by examiner

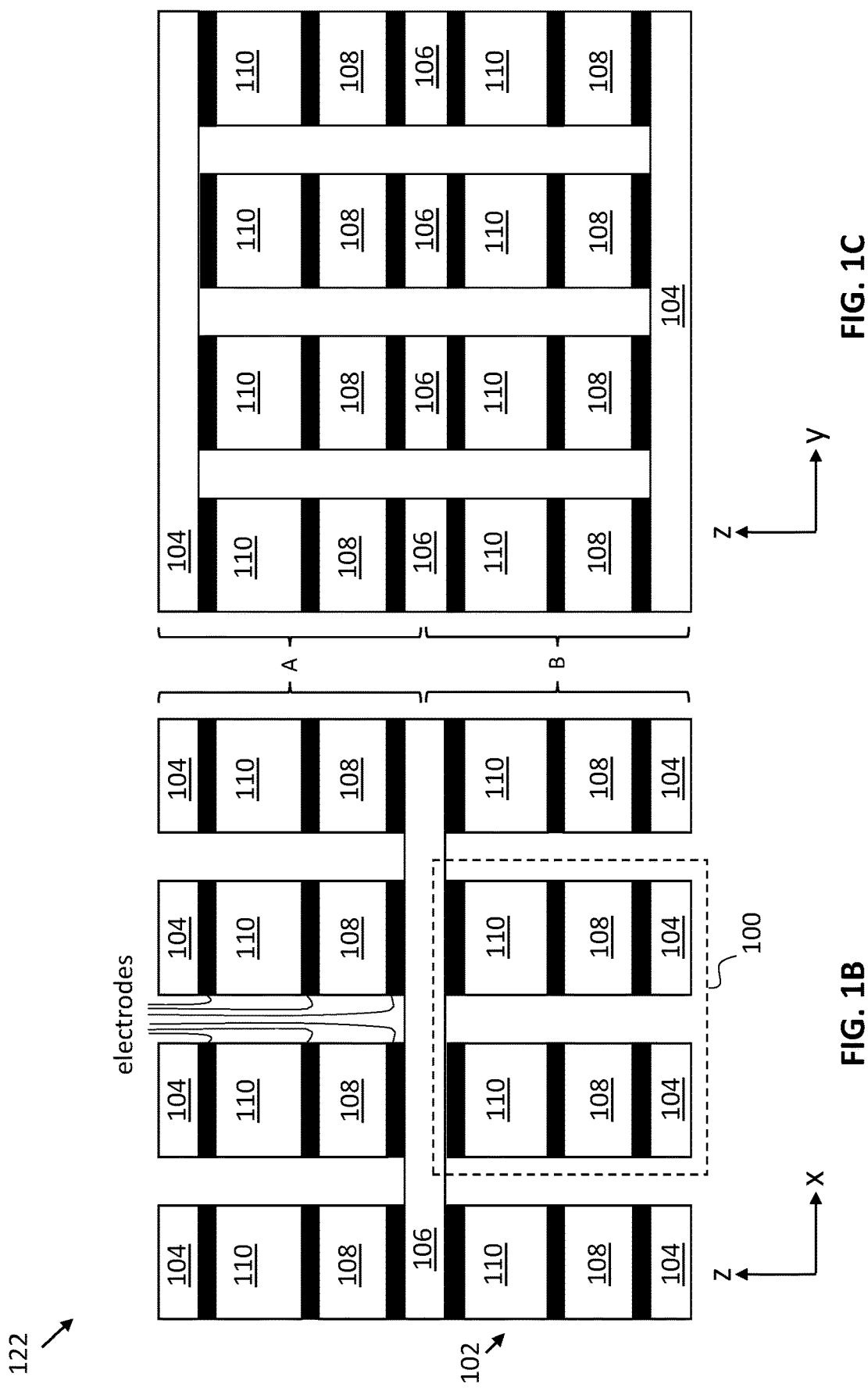

MEMORY DEVICE WITH INCREASED ELECTRODE RESISTANCE TO REDUCE TRANSIENT SELECTION CURRENT

BACKGROUND

As electronic devices continue to become smaller and more complex, the need to store more data and access that data quickly similarly grows. New memory architectures have been developed that use an array of memory cells with so-called phase change materials (PCM) that have variable bulk resistance, allowing the resistance value to dictate whether a given memory cell stores a logic '0' or a logic '1'. Many challenges exist when fabricating such PCM-based memory architectures.

BRIEF DESCRIPTION OF THE DRAWINGS

Features and advantages of embodiments of the claimed subject matter will become apparent as the following Detailed Description proceeds, and upon reference to the Drawings, in which:

FIGS. 1B and 1C illustrate cross-section views of a stacked array of memory cells, in accordance with some embodiments of the present disclosure. The views are orthogonal with respect to each other.

Figure 1A:
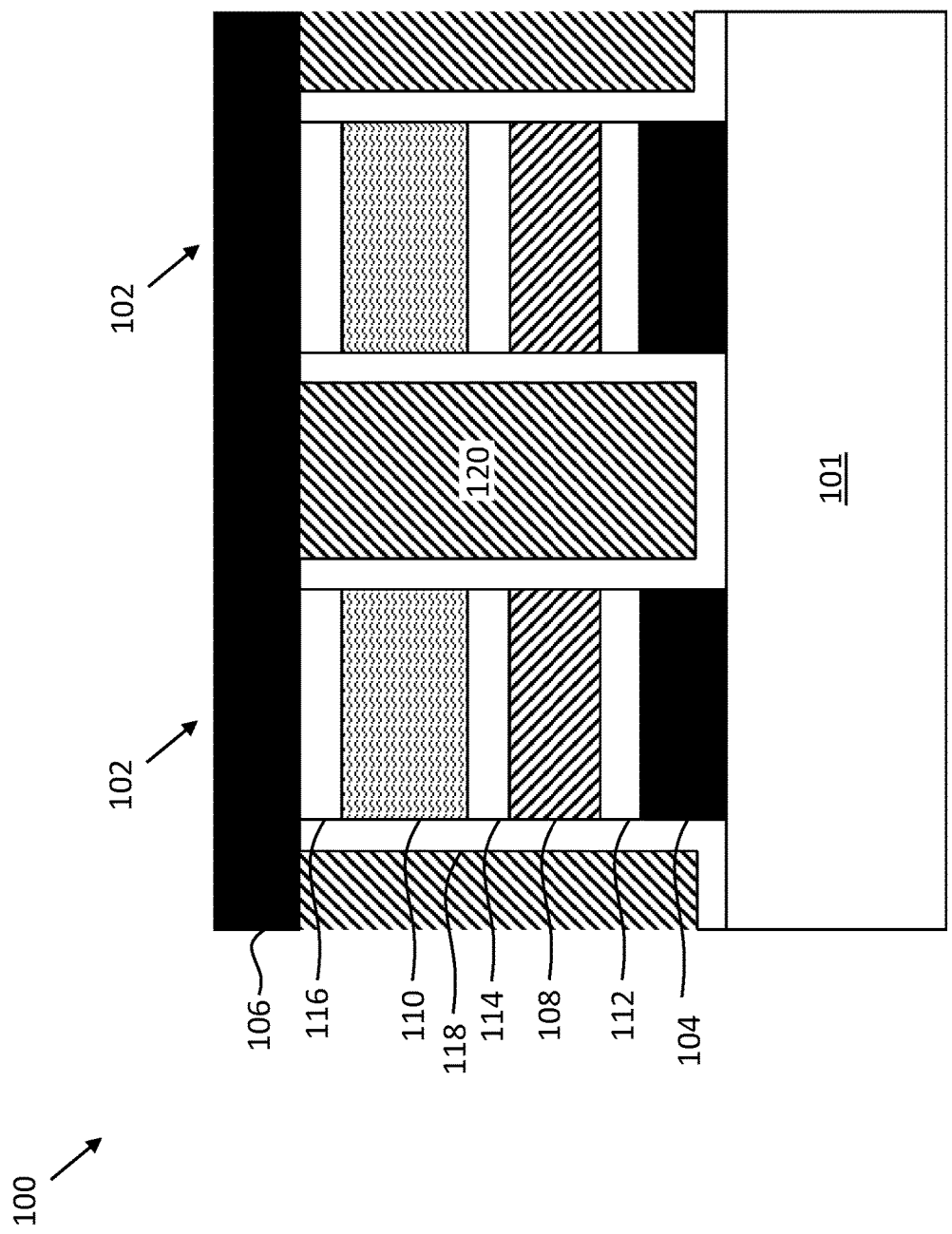
FIG. 1A illustrates a cross-section view of a portion of a stacked array of memory cells, in accordance with some embodiments of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

A memory cell design is disclosed. The design is particularly well-suited for three-dimensional cross-point (3D X-point) memory configurations, although other memory applications that can benefit will be apparent. Various embodiments of the memory cell design include one or more electrodes having an increased resistance compared to previous memory cell designs or compared to other electrodes within a same memory cell. A memory device includes an array of memory cells with each memory cell arranged, for instance, between a word line and a bit line of the memory device. In one such example embodiment, each memory cell includes a stack of layers having a phase change layer, a selector layer, an electrode, and an interface layer in contact with the electrode. The interface layer includes, for example, tungsten, aluminum, silicon, oxygen, boron, or nitrogen. In some embodiments, the interface layer includes tungsten, silicon, and nitrogen. In another example embodiment, each memory cell includes a stack of layers having a phase change layer, a selector layer, and a plurality of electrodes, where one electrode of the plurality of electrodes has a greater thickness than one or more of the other electrodes of the plurality of electrodes. In another example embodiment, each memory cell includes a stack of layers having a phase change layer, a selector layer, and a plurality of electrodes, where one electrode of the plurality of electrodes has a greater resistivity than one or more of the other electrodes of the plurality of electrodes. As will be appreciated in light of this disclosure, each of the electrode modifications increases a resistance of the electrode which reduces the amplitude of unwanted transient currents when selecting the memory cell. Numerous configurations and embodiments will be apparent.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of electrodes configured to increase their resistance (e.g., thicker electrodes, different material compositions, added layers) as variously described herein. Numerous configurations and variations will be apparent in light of this disclosure.

General Overview

As noted above, there are several non-trivial issues associated with fabricating memory arrays based on bulk resistance changes of a phase-change material. For example, in some cases, the phase change material is included as a layer in a multi-layer stack that further includes a selector layer as well as electrode material layers that sandwich each of the phase change material and the selector layer. This multi-layer stack is then etched into an array of smaller individual stacks. Each individual stack can be used as one memory cell in the overall memory array. When selecting a particular memory cell in the array, a potential (voltage) is applied across the corresponding word line and bit line that intersect over the selected memory cell to apply current through the selected memory cell. However, this process can also cause transient current spikes to occur that can have a high enough magnitude to damage the sensitive phase change material. Current memory architectures fail to reduce or eliminate these current spikes.

To this end, techniques and memory cell designs are provided herein to help eliminate or otherwise reduce the occurrence of such issues. In some example embodiments, memory cell structures are provided that have increased electrode resistance. Purposefully increasing the resistance of the electrodes would seem counterintuitive, as memory cell designs typically aim to achieve a lowest possible resistance to increase access speed and reduce power consumption. However, and as will be appreciated in light of this disclosure, by increasing the electrode resistance, the trade-off of reducing the transient current spikes with a slight decrease in access speed and/or a slight increase in power consumption is worth it for at least some applications, as the reduction in transient current is found to drastically reduce the bit-error rate of the memory cell.

Various operations may be described as multiple discrete actions or operations in turn, in a manner that is most helpful in understanding the claimed subject matter. However, the order of description should not be construed as to imply that these operations are necessarily order dependent. In particular, these operations may be performed in a different order from the described embodiment. Various additional operations may be performed, and/or described operations may be omitted in additional embodiments.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. For convenience, the phrase "FIG. 1" may be used to refer to the collection of drawings of FIGS. 1A-1C.

It should be readily understood that the meaning of "above" and "over" in the present disclosure should be interpreted in the broadest manner such that "above" and "over" not only mean "directly on" something but also include the meaning of over something with an intermediate feature or a layer therebetween. Additionally, the meaning of "on" in the present disclosure should be interpreted to mean directly on something (i.e., having no intermediate feature or layer therebetween.)

Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer. A substrate can be a layer, can include one or more layers therein, and/or can have one or more layer thereupon, thereabove, and/or therebelow.

Memory Array Architecture

FIG. 1A illustrates a cross-section view of a portion 100 of a memory cell array over a substrate 101, according to an embodiment. Portion 100 includes adjacent memory cells 102 each including a stack of material layers sandwiched between a particular word line 104 and bit line 106, according to some embodiments. A potential is applied across a particular word line 104 and a particular bit line 106 in order to read from or program the memory cell 102 at the intersection of (between) the chosen word line 104 and chosen bit line 106. In this manner, word lines 104 and bit lines 106 provide top and bottom electrodes to memory cells 102. As noted in this example, word lines 104 run orthogonal to bit lines 106. Word lines 104 and bit lines 106 may be made of any conductive material, such as a metal, metal alloy, or polysilicon. In some examples, word lines 104 and bit lines 106 are made of tungsten, silver, aluminum, gold, carbon, or copper, or a multi-layer structure comprising such materials (e.g., tungsten and carbon layers).

Each memory cell 102 includes a stack of layers having at least one selector layer 108, at least one phase change layer 110, and one or more intermediate electrodes 112, 114, 116 according to an embodiment. Selector layer 108 includes a material that acts similarly to a diode and is highly resistive until a threshold potential is applied across it, at which point its resistance lowers and current passes through it, according to some embodiments. Examples of materials for selector layer 108 include chalcogenide-based alloys, such as germanium telluride or germanium antimony telluride doped with arsenic. Any number of chalcogenides can be used to provide a standard selector layer 108. Proprietary selectors may be used as well in conjunction with the techniques provided herein, as will be appreciated.

As used herein, the term "selector layer" refers to the standard meaning of that phrase in the context of memory devices, and in some cases refers to one or more layers that includes a material capable of acting as a selector. For example, at least one selector layer 108 of the memory cell array may include a chalcogenide alloy, such as chalcogenide doped with arsenic. The selector layer 108 effectively provides access to the bit (logic '0' or '1') stored by the phase change layer 110.

Phase change layer 110 includes a material that changes its phase to either represent a logic '0' or a logic '1' for the given memory cell 102. As used herein, the term "phase change layer" refers to the standard meaning of that phrase in the context of memory devices, and in some cases refers to one or more layers that includes a metalloid alloy. The metalloids include boron (B), silicon (Si), germanium (Ge), arsenic (As), antimony (Sb), tellurium (Te), and polonium (Po). In some embodiments, phase change layer 110 includes chalcogenide, which comprises an alloy of germanium, arsenic, antimony, and tellurium, such as GeTe, GeSbTe, GeBiTe (GeTe alloyed with bismuth), or GeInSbTe (GeSbTe alloyed with indium), to name a few non-limiting examples. Moreover, note the stoichiometry of such compounds may vary from one embodiment to the next, and such compounds represented without stoichiometric coefficients or values are intended to represent all forms of that compound.

In one example, chalcogenide is used as the phase change material and can change between an amorphous state or phase and a crystalline state or phase based on applied temperature. In its amorphous state, the chalcogenide molecules are disorganized, and the material becomes highly resistive. In its crystalline state, the chalcogenide molecules are ordered, and the material becomes less resistive. For the purpose of the memory bit, the amorphous state of the chalcogenide may be read as a logic '0' and the crystalline state of the chalcogenide may be read as a logic '1', according to an embodiment.

Each of one or more intermediate electrodes 112, 114, and 116 provide enhanced ohmic contact for selector layer 108 and phase change layer 110, and also separate the highly reactive materials in both selector layer 108 and phase change layer 110 from each other. Each of one or more intermediate electrodes 112, 114, and 116 may comprise carbon, though other conductive materials may be used as well. According to some embodiments, one or more of intermediate electrodes 112, 114, and 116 has an increased resistance via a variety of possible modifications such as increased thickness, doping with impurities, altered interface resistance, and/or adding an additional interface layer. These modifications are described in more detail with reference to FIGS. 3-6.

Sidewalls of each memory cell 102 are protected by a liner structure 118. Although liner structure 118 is illustrated as being a single continuous film, liner structure 118 may be deposited as a series of material films or layers over the course of a plurality of deposition cycles. Dielectric materials, such as silicon nitride, may be deposited as part of liner structure 118. A fill dielectric 120 is used between adjacent memory cells 102. In some embodiments, fill dielectric can be any dielectric material, such as silicon oxide.

FIGS. 1B and 1C illustrate cross-section views of a memory array 122, according to some embodiments. Portion 100 of memory array 122 includes two memory cells 102 of the plurality of arrayed memory cells. The cross-section views are taken orthogonally to one another in memory array 122. Memory array 122 includes a plurality of memory cells 102 arranged in arrays A and B stacked in the Z-direction to form a 3D memory structure. The array 122 includes an ordered arrangement of rows and columns of memory cells 102 in the XY plane as illustrated in FIGS. 1B and 1C. Other ordered arrangements are possible as well, as will be appreciated. Each memory cell 102 generally includes a selector layer 108, a phase change layer 110, and a plurality of electrodes (which are depicted as solid black bars in FIGS. 1B and 1C) that sandwich each of selector layer 108 and phase change layer 110. According to some embodiments, sidewalls of each memory cell 102 are protected by a liner structure (such as shown in FIG. 1A).

As can be further seen, memory array 122 includes a plurality of word lines 104 and bit lines 106 used to address a particular memory cell 102 with the stack. As noted in this example, word lines 104 run orthogonal to bit lines 106 and memory array 122 alternates between word lines 104 and bit lines 106 in the Z-direction. With further reference to FIGS. 1B and 1C, word lines 104 run along the Y-direction (into and out of the page in FIG. 1B), and bit lines 106 run along the X-direction (into and out of the page in FIG. 1C). As will be appreciated, the identification of a bit line does not limit the ability for the same conductive line to also act as a word line and visa-versa. Whether a particular conductive line acts as a bit line or a word line can depend on the application.

It will be appreciated that the number of memory cells 102 illustrated is purely used as an example, and that any number of memory cells 102 can be used in each tier, and that any number of tiers in the Z-direction can be used as well. According to some embodiments, the height in the Z-direction of a given memory cell 102 is between about 100 nm and about 150 nm. According to some example embodiments, the width in either the X-direction or the Y-direction of a given memory cell 102 is between about 10 nm and about 20 nm. The width may be the same in both the X-direction and the Y-direction. Any number of memory cell geometries can be utilized, as will be appreciated.

Figure 2:
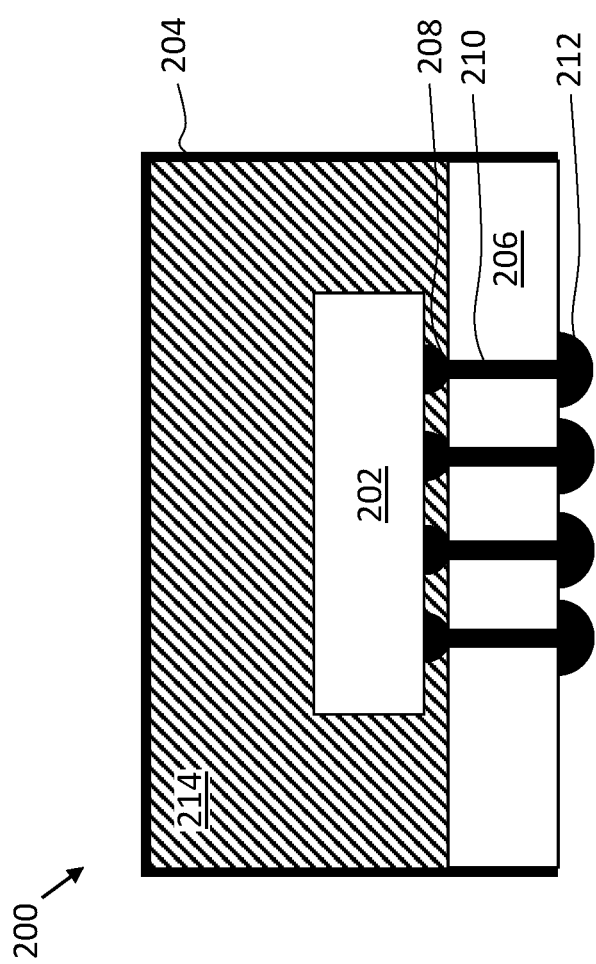
FIG. 2 illustrates a cross-section view of a chip package containing one or more memory dies, in accordance with some embodiments of the present disclosure.

FIG. 2 illustrates an example embodiment of a chip package 200. As can be seen, chip package 200 includes one or more dies 202. Chip package 200 may be a memory device when one or more dies 202 include one or more memory dies, whether it be a dedicated memory die, or some other die that has a memory portion juxtaposed to other functional circuitry of the die (e.g., such as a processor that has on-board memory). Die 202 may include any number of memory arrays 122 as well as any other circuitry used to interface with the memory arrays, in some example configurations. In still other embodiments, memory arrays 122 may be present on one die 202 and other circuitry used to interface (e.g., cell selection circuitry, readout circuitry, and programming circuitry) with die 202 is on another die within chip package 200.

As can be further seen, chip package 200 includes a housing 204 that is bonded to a package substrate 206. The housing 204 may be any standard or proprietary housing, and provides, for example, electromagnetic shielding and environmental protection for the components of chip package 200. The one or more dies 202 may be conductively coupled to a package substrate 206 using connections 208, which may be implemented with any number of standard or proprietary connection mechanisms, such as solder bumps, ball grid array (BGA), pins, or wire bonds, to name a few examples. Package substrate 206 may be any standard or proprietary package substrate, but in some cases includes a dielectric material having conductive pathways (e.g., including conductive vias and lines) extending through the dielectric material between the faces of package substrate 206, or between different locations on each face. In some embodiments, package substrate 206 may have a thickness less than 1 millimeter (e.g., between 0.1 millimeters and 0.5 millimeters), although any number of package geometries can be used. Additional conductive contacts 212 may be disposed at an opposite face of package substrate 206 for conductively contacting, for instance, a printed circuit board. One or more vias 210 extend through a thickness of package substrate 206 to provide conductive pathways between one or more of connections 208 to one or more of contacts 212. Vias 210 are illustrated as single straight columns through package substrate 206 for ease of illustration, although other configurations can be used (e.g., damascene, dual damascene, through-silicon via, to name a few example configurations). In still other embodiments, vias 210 are fabricated by multiple smaller stacked vias, or are staggered at different locations across package substrate 206. In the illustrated embodiment, contacts 212 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 212, to inhibit shorting.

In some embodiments, a mold material 214 may be disposed around the one or more dies 202 included within housing 204 (e.g., between dies 202 and package substrate 206 as an underfill material, as well as between dies 202 and housing 204 as an overfill material). Although the dimensions and qualities of the mold material 214 can vary from one embodiment to the next, in some embodiments, a thickness of mold material 214 is less than 1 millimeter. Example materials that may be used for mold material 214 include epoxy mold materials, as suitable. In some cases, the mold material 214 is thermally conductive so that heat is propagated to the housing and/or heat sink (if present), in addition to being electrically insulating.

Increased Electrode Resistance Example Embodiments

FIGS. 3-6 illustrate cross-section views of a portion of a memory cell array that includes two memory cells 102 having an electrode with an increased resistance, according to some embodiments. Any of the memory cell architectures discussed in FIGS. 3-6 may be used within memory array 122.

Figure 3:
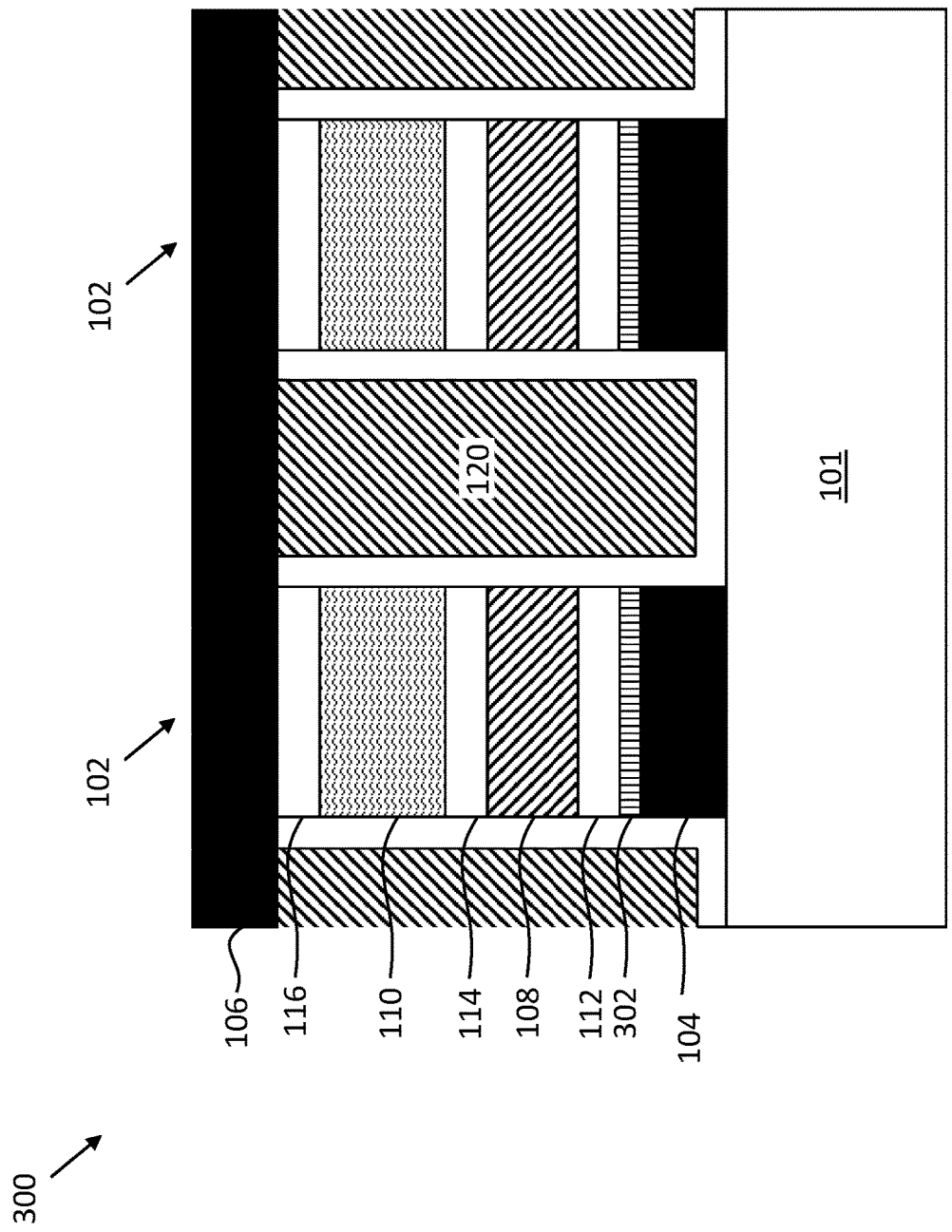
FIG. 3 illustrates a cross-section view of a portion of a stacked array of memory cells having a first electrode configuration, in accordance with an embodiment of the present disclosure.

FIG. 3 illustrates a portion 300 of a memory cell array that includes many of the same layers discussed above in portion 100 of the memory cell array from FIG. 1. As such, the description of these same-labeled layers applies equally for portion 300 of the memory cell array as it did for portion 100 of the memory cell array. According to this particular example embodiment, an additional material layer 302 is deposited between electrode 112 and word line 104. The combined layer structure of material layer 302 and electrode 112 provides an increased resistance compared to having just electrode 112. Furthermore, this resistance can be greater compared to the resistance of either one of electrode 114 or electrode 116.

According to some such example embodiments, additional material layer 302 comprises tungsten, silicon, and nitrogen. In some such embodiments, additional material layer 302 consists of tungsten and silicon (e.g., tungsten silicide). In some embodiments, additional material layer 302 includes any of tungsten, aluminum, silicon, oxygen, boron, or nitrogen. Material layer 302 may be deposited using standard deposition techniques, such as chemical vapor deposition (CVD), physical vapor deposition (PVD), and atomic layer deposition (ALD) to a thickness, for example, between about 20 Å and about 50 Å.

Material layer 302 is illustrated as being adjacent to electrode 112. In some other embodiments, material layer 302 can be adjacent to electrode 114 or to electrode 116. Furthermore, material layer 302 may be adjacent on either the top side or bottom side of any of electrodes 112, 114, or 116. In some embodiments, more than one material layer 302 is provided adjacent to any of electrodes 112, 114, and 116 such that the resistance is increased for more than one electrode in a given memory cell 102. In some cases, it may be preferable to arrange material layer 302 adjacent to electrode 112 since this is the farthest electrode from phase change layer 110, and thus presents a lower risk contaminating phase change layer 110.

Figure 4:
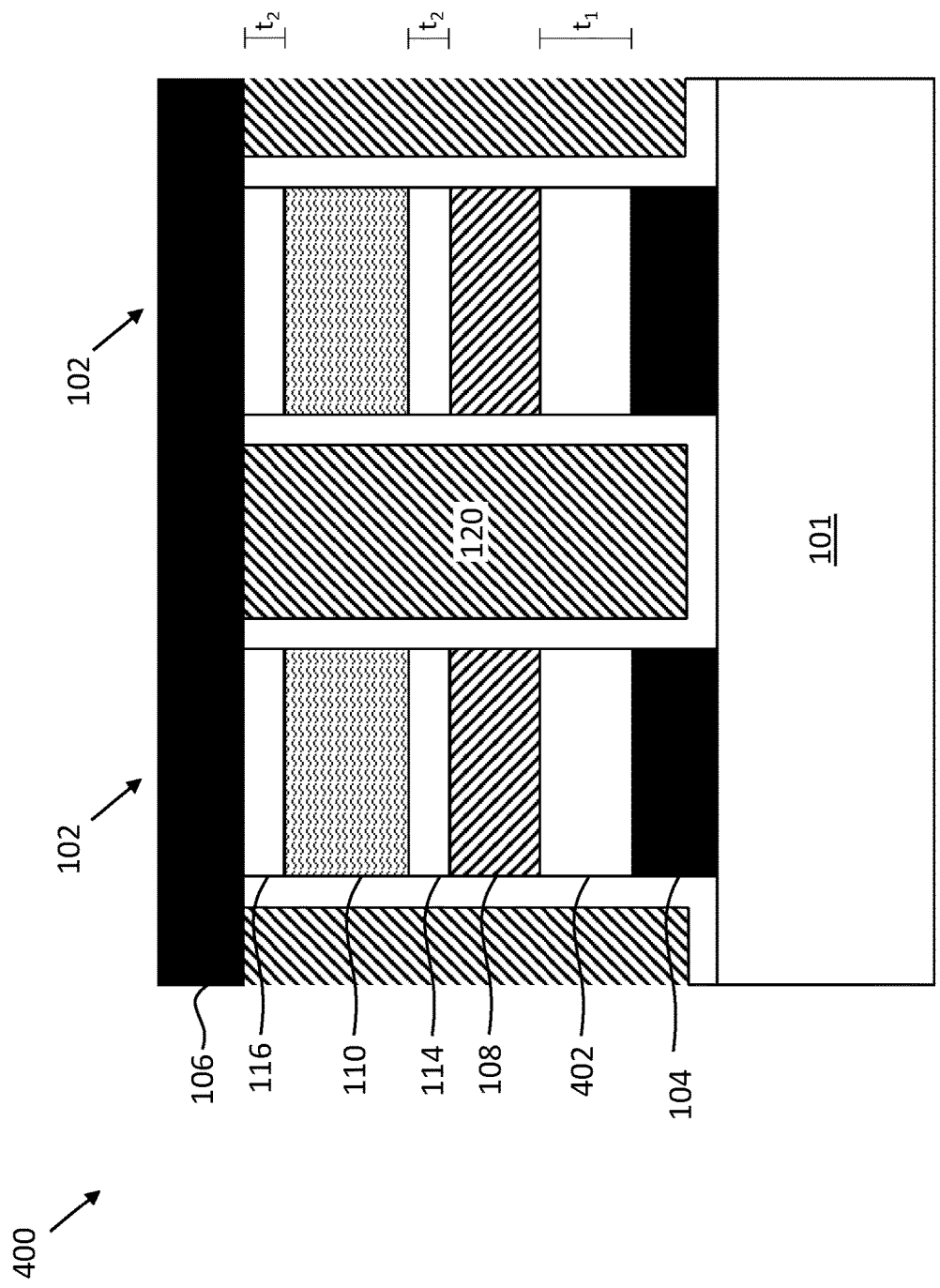
FIG. 4 illustrates a cross-section view of a portion of a stacked array of memory cells having a second electrode configuration, in accordance with an embodiment of the present disclosure.

FIG. 4 illustrates a portion 400 of a memory cell array that includes many of the same layers discussed above in portion 100 of the memory cell array from FIG. 1. As such, the description of these same-labeled layers applies equally for portion 400 of the memory cell array as it did for portion 100 of the memory cell array. According to this particular example embodiment, electrode 402 is formed with a greater thickness $t_1$ compared to a thickness $t_2$ of either of electrode 114 or electrode 116. Electrode 402 may include a similar composition compared to electrodes 114 and 116. Accordingly, electrode 402 may include carbon, in some such embodiments. In some example cases, electrode 402 has a thickness $t_1$ that is up to 10%, 20%, 30%, 40%, 50%, 60%, 70%, 80%, 90%, or 100% thicker compared to thickness $t_2$ of either electrode 114 or electrode 116. The greater thickness of electrode 402 increases the resistance of current flow through memory cell 102. In some such example embodiments, increasing the thickness of electrode 402 causes an increase in memory cell resistance of about 5%.

Although only electrode 402 is illustrated as having a greater thickness, this is only one example, and in some other embodiments, any or all of electrodes 402, 114, and 116 can have an increased thickness to raise the resistance of memory cell 102.

Figure 5:
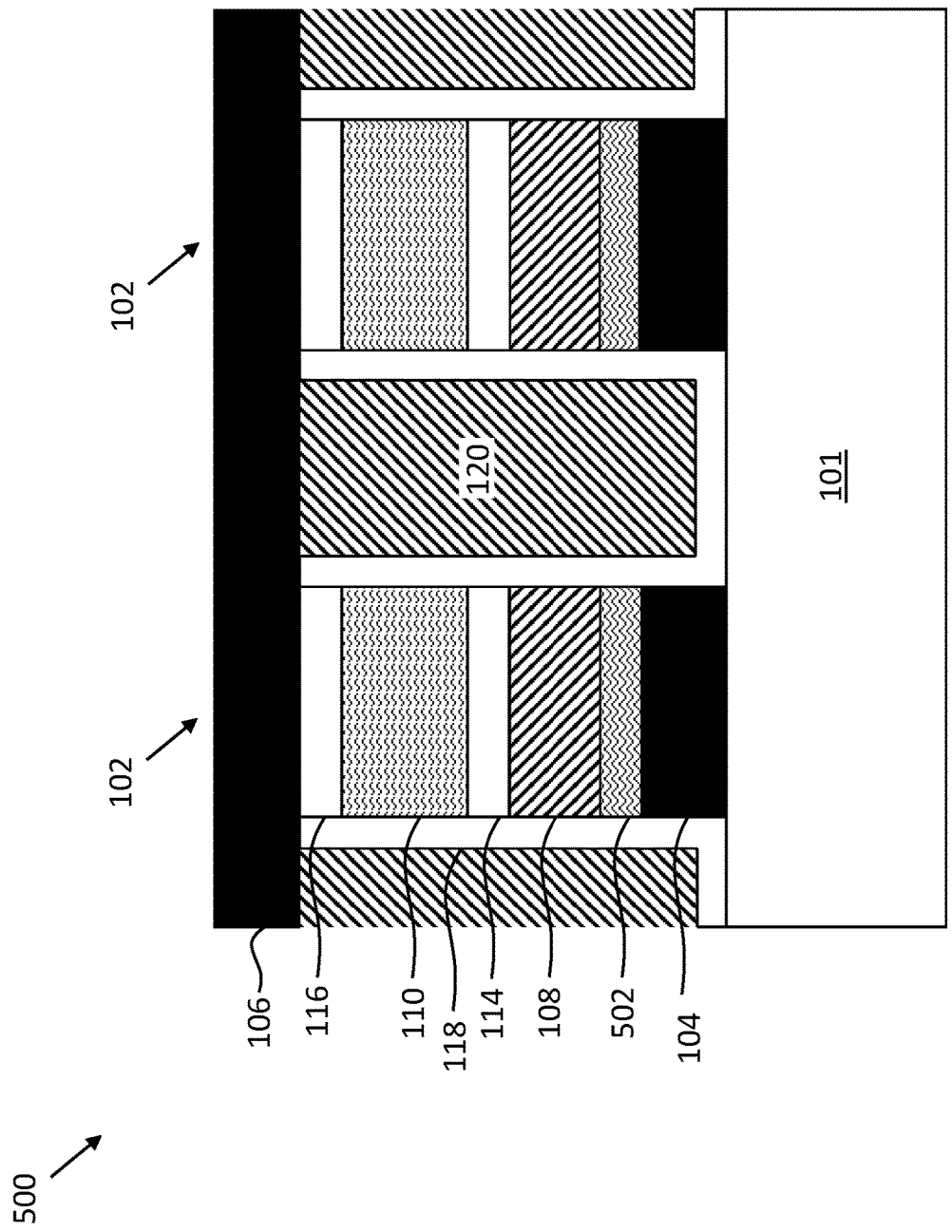
FIG. 5 illustrates a cross-section view of a portion of a stacked array of memory cells having a third electrode configuration, in accordance with an embodiment of the present disclosure.

FIG. 5 illustrates a portion 500 of a memory cell array that includes many of the same layers discussed above in portion 100 of the memory cell array from FIG. 1. As such, the description of these same-labeled layers applies equally for portion 400 of the memory cell array as it did for portion 100 of the memory cell array. According to this particular example embodiment, electrode 502 has a different material composition with a higher resistivity compared to either of electrodes 114 or 116. In some embodiments, electrode 502 is carbon-based and doped with impurities to increase the resistivity. In some examples, electrode 502 includes carbon doped with impurities such as any of oxygen, nitrogen, boron, or others.

Although only electrode 502 is illustrated as having a different material composition, this is only one example, and in some other embodiments, any or all of electrodes 502, 114, and 116 can have a different material composition with an increased resistivity to raise the resistance of memory cell 102. In some cases, it may be preferable to only change the material composition of electrode 502 since this is the farthest electrode from phase change layer 110, and thus presents a lower risk of contaminating phase change layer 110.

Any of the various examples of increasing cell resistance discussed above in FIGS. 3-5 can be combined together for any of the various electrodes within a given memory cell. That is, any of electrodes 112, 114, and 116 can each have one or more of an increased thickness, a material composition with an increased resistivity, or an added material layer adjacent to the electrode.

In some embodiments, the interface resistance can also be increased for a given electrode within memory cell 102. For example, after depositing a carbon layer to act as one of the electrodes, a chemical cleaning procedure may be performed on the exposed surface of the carbon layer to change the bonding interface at the surface. In some other examples, a plasma treatment or other reactive gas treatment may be performed on the exposed surface of the carbon layer to change the structure of the bonds at the interface and/or form defects at the interface to increase the resistance. Any method used to change the interface resistance can be combined with one or more of the other techniques discussed in FIGS. 3-5 to increase the overall resistance of the memory cell.

Figure 6:
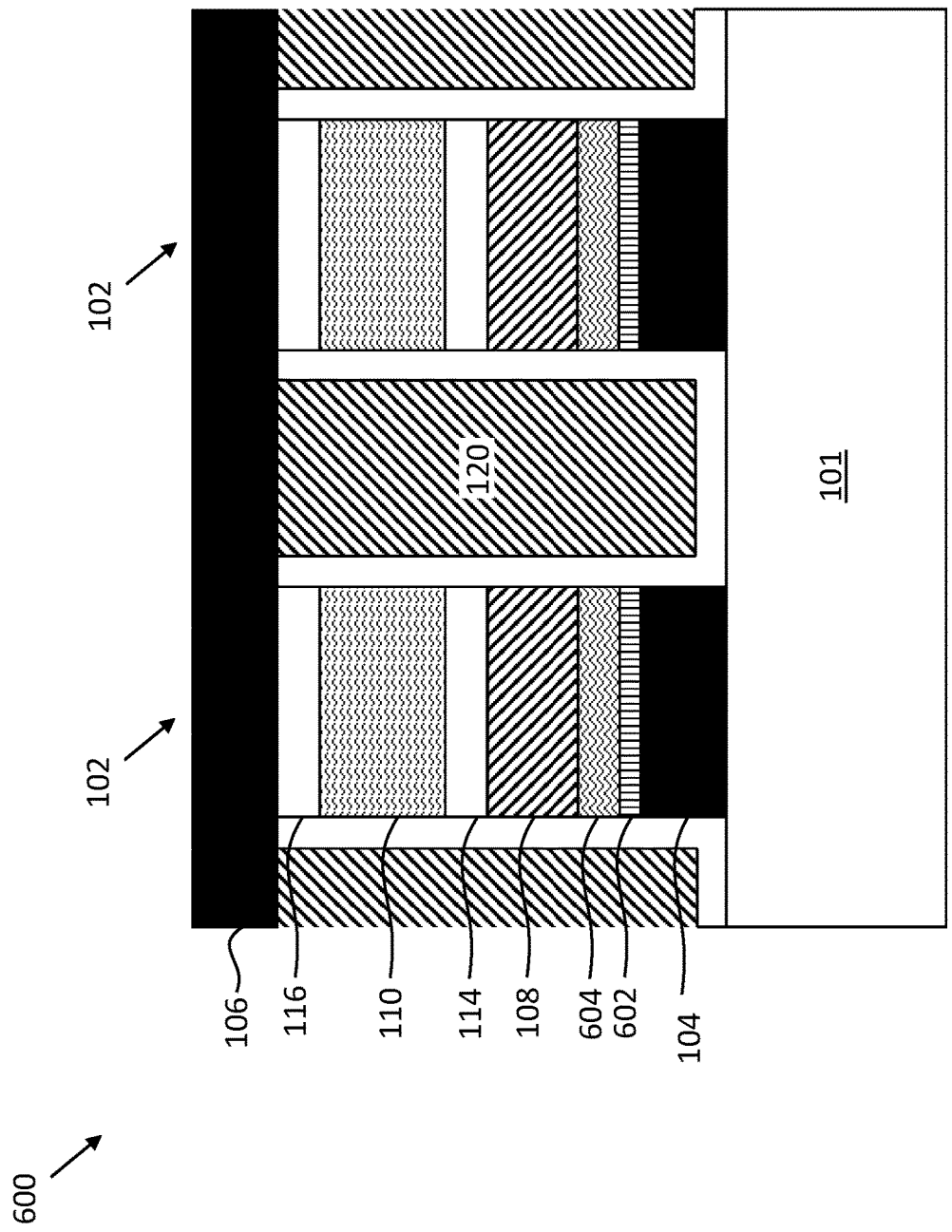
FIG. 6 illustrates a cross-section view of a portion of a stacked array of memory cells having a fourth electrode configuration, in accordance with an embodiment of the present disclosure.

FIG. 6 illustrates one example of a portion 600 of a memory cell that combines both an additional material layer 602 (such as 302) with an electrode 604 having a different material composition (e.g., with a higher resistivity, such as 502) compared with electrodes 114 and 116. Material layer 602 may include one or more of tungsten, silicon, aluminum, oxygen, boron, or nitrogen while electrode 604 includes doped carbon forming an interface exhibiting a resistance increase of about 20%, according to some embodiments. Other embodiments may exhibit a different resistance increase.

Table 1 below summarizes the changes to certain memory cell parameters based on an increase to electrode vertical thickness or the inclusion of an interface layer with a doped carbon electrode.

TABLE 1

Memory cell parameters for different electrode configurations.

| | Example of application: 3DXP | | |
|---|---|---|---|
| | Ref (BE THK = X) | +BE THK (1.5X) | +Interface (CX as an example) |
| Cell R increase (@Program Current) | Ref | +5% | +20% |
| Cell VT | Ref | +0.5% | +1.6% |
| Max current | Ref | −1.7% | −2.5% |
| Current Spike | Ref | −7% | −29% |
| Read-Disturb reduction | Ref | 2x | 12x |

As seen in Table 1, the memory cell resistance increases by around 5% when using a bottom electrode (BE) having a 50% thickness increase, and the resistance increases by around 20% when using the added material layer (e.g., a tungsten silicide-nitride layer, tungsten silicide, or aluminum oxide layer) with a carbon-based electrode. It should be noted that, in some embodiments, the BE is identified as the electrode that is not adjacent to the phase change layer.

The threshold voltage of the memory cell does increase when increasing the cell resistance, as is to be expected. Additionally, the max current through the cell upon supplying the threshold voltage decreases slightly with increasing resistance. However, these effects are compensated by the large reduction in the transient selection current spike (e.g., provided at 100 ps after activation). Additionally, the decrease in the transient current spike yields a reduction in the read-disturb metric (synonymous with the bit-error rate). Merely increasing the thickness of the BE yields a 2× reduction in the bit-error rate, while adding the material layer with the carbonitride electrode yields a 12× reduction in the bit-error rate.

Figure 7:
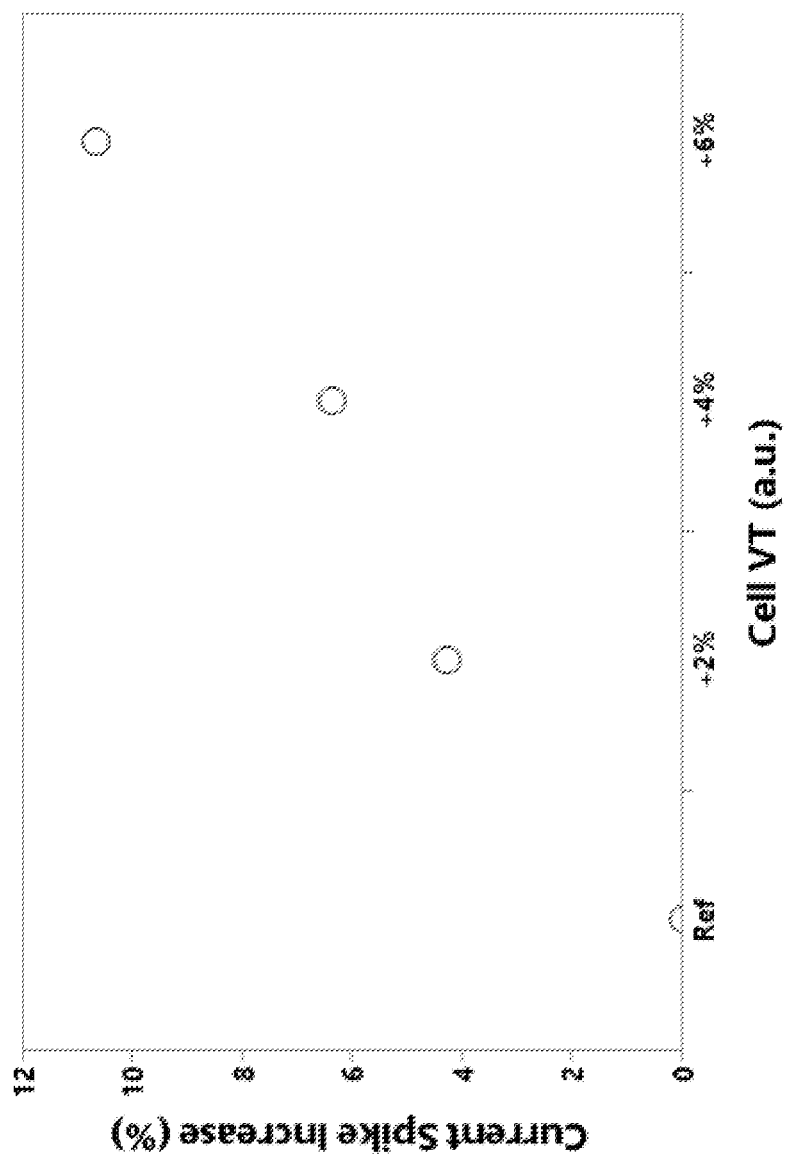
FIG. 7 is a data plot showing measured current spikes for different memory cell threshold voltages.

FIG. 7 is a data plot showing the percent increase in transient current spike amplitude (e.g., occurring at 100 ps after memory cell activation) for memory cells of increasing threshold voltage. The higher threshold memory devices exhibit larger transient current spikes, however larger memory arrays typically use memory cells having a higher threshold voltage. This higher transient current causes an increase in the bit-error rate of the memory cell and is a significant limiting factor in stacked phase change memory arrays such as 3D XPoint memory.

Figure 8:
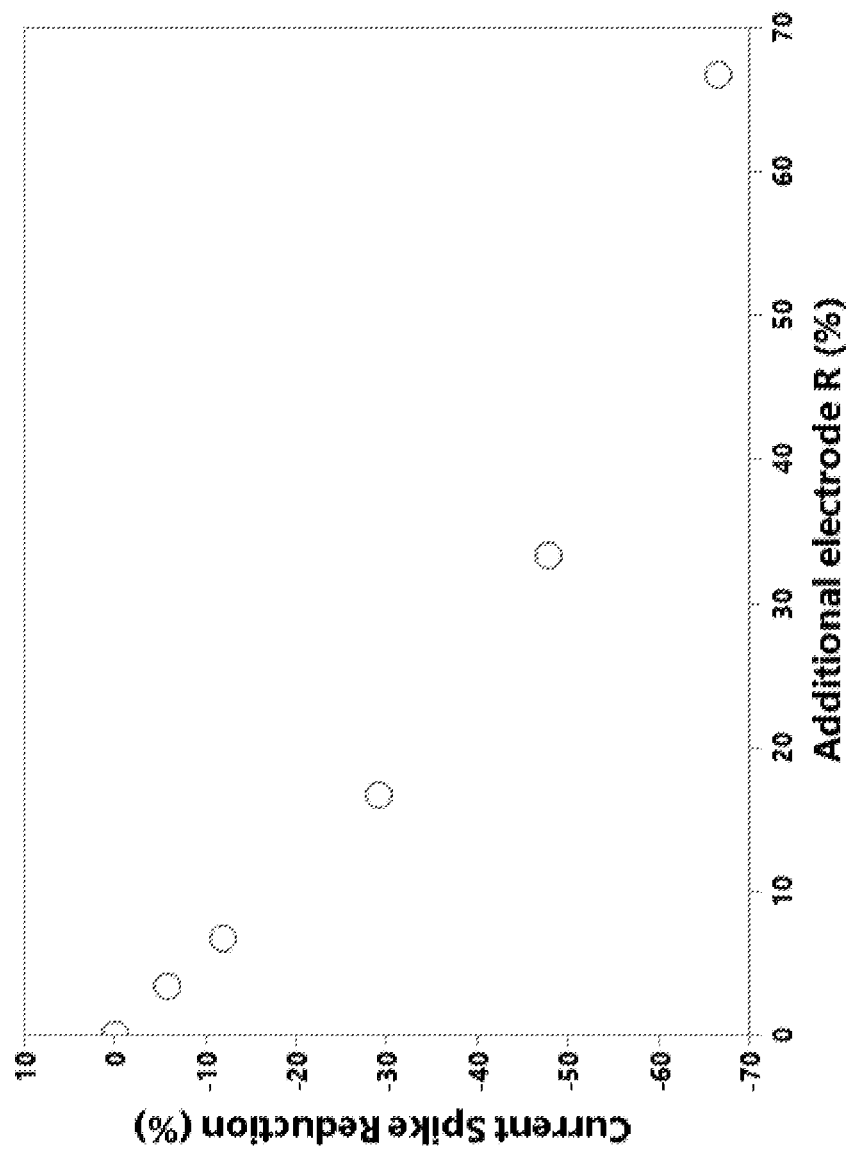
FIG. 8 is a data plot showing decreasing measured current spikes for higher memory cell electrode resistance.

FIG. 8 is another data plot showing the % increase in transient current spike amplitude (e.g., occurring at 100 ps after memory cell activation) for memory cells with increased electrode resistance using one or more of the techniques discussed herein. As seen from the data, an increase in electrode resistance causes a clear decrease in the transient current spike. For example, increasing the electrode resistance by around 20% yields around a 30% decrease in the measured transient current spike. Even just increasing the electrode resistance by around 10% yields around a 15% decrease in the measured transient current spike.

Example Fabrication Procedure

FIGS. 9-12 illustrate cross-section views of different stages of a fabrication process for portion 100 of memory array 122, according to some embodiments of the present disclosure. The various layers and structures illustrated in FIGS. 9-12 are not intended to be drawn to scale but are illustrated in a particular fashion for clarity. Some intermediate processes may be performed that are not explicitly illustrated, as will be appreciated (e.g., such as polishing and cleaning processes, or other standard processing).

Figure 9:
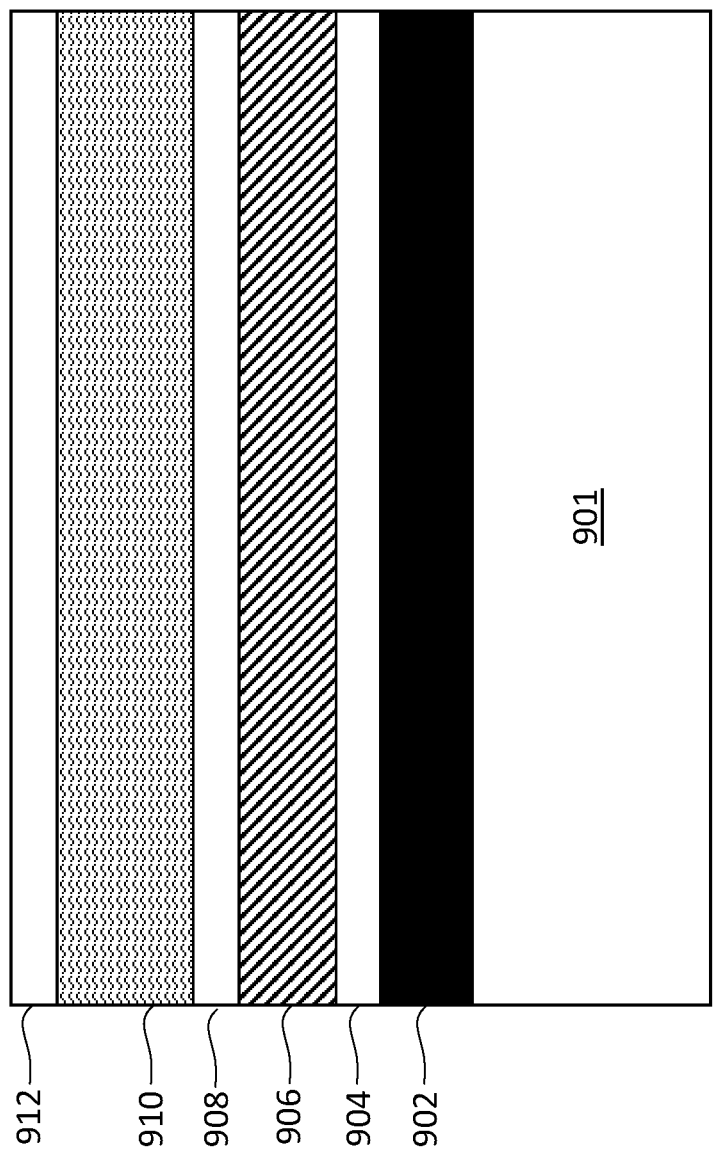
FIG. 9 illustrates a cross-section view of a stage in a fabrication process for a portion of a memory device, in accordance with some embodiments of the present disclosure.

FIG. 9 illustrates a stack of material layers deposited over a substrate 901, according to some embodiments. Substrate 901 may be any suitable substrate material for forming additional material layers over it. In some embodiments, substrate 901 includes a semiconductor material such as silicon, germanium, silicon germanium, gallium arsenide, or indium phosphide. Substrate 901 may include one or more insulating layers at its top surface, such as silicon oxide or silicon nitride, or buried below a top semiconductor layer such as in semiconductor-on-insulator substrate configurations.

A first conductive layer 902 may be deposited over the top surface of substrate 901. First conductive layer 902 may be a metal, such as tungsten, silver, aluminum, titanium, cobalt, copper, or an alloy. In some embodiments, first conductive layer 902 has a sufficient thickness (e.g., 1 to 50 nm thick) to propagate signals after first conductive layer 902 has been patterned into word lines or bit lines.

A first electrode layer 904 may be deposited on first conductive layer 902, followed by at least one selector layer 906, and a second electrode layer 908. Each of first electrode layer 904 and second electrode layer 908 may include any conductive material that enhances the ohmic contact being made to at least one selector layer 906. In one example, first electrode layer 904 and second electrode layer 908 comprise carbon.

Next, at least one phase change layer 910 is deposited over second electrode layer 908. As can be further seen, a third electrode layer 912 may also be deposited over phase change layer 910 to provide an ohmic contact to phase change layer 910. Third electrode layer 912 may similarly comprise carbon. In some embodiments, each of electrode layers 904, 908, and 912 comprise the same material.

As noted above, other material layers may be deposited during, before, or after the deposition of any of the material layers discussed above depending on the application. The various layers may be deposited using standard deposition techniques, such as chemical vapor deposition (CVD), physical vapor deposition (PVD), and atomic layer deposition (ALD) techniques.

Any one or more of electrode layers 904, 908, and 912 can have its resistance increased using any of the techniques discussed herein. For example, one or more of electrode layers 904, 908, and 912 may have an increased thickness compared to the other electrode layers, an increased resistivity compared to the other electrode layers, or may include an additional material layer deposited either directly before or directly after the electrode layer. In some embodiments, the interface resistance of any of electrode layers 904, 908, and 912 can be increased via chemical cleaning or plasma treatment. As noted above, increasing the resistance of one or more of electrode layers 904, 908, and 912 increases the resistance of the memory cell and reduces the transient selection current. The remaining example fabrication procedures can be performed the same way regardless of what techniques are performed to increase the resistance of one or more of electrode layers 904, 908, and 912, as will be appreciated.

Figure 10:
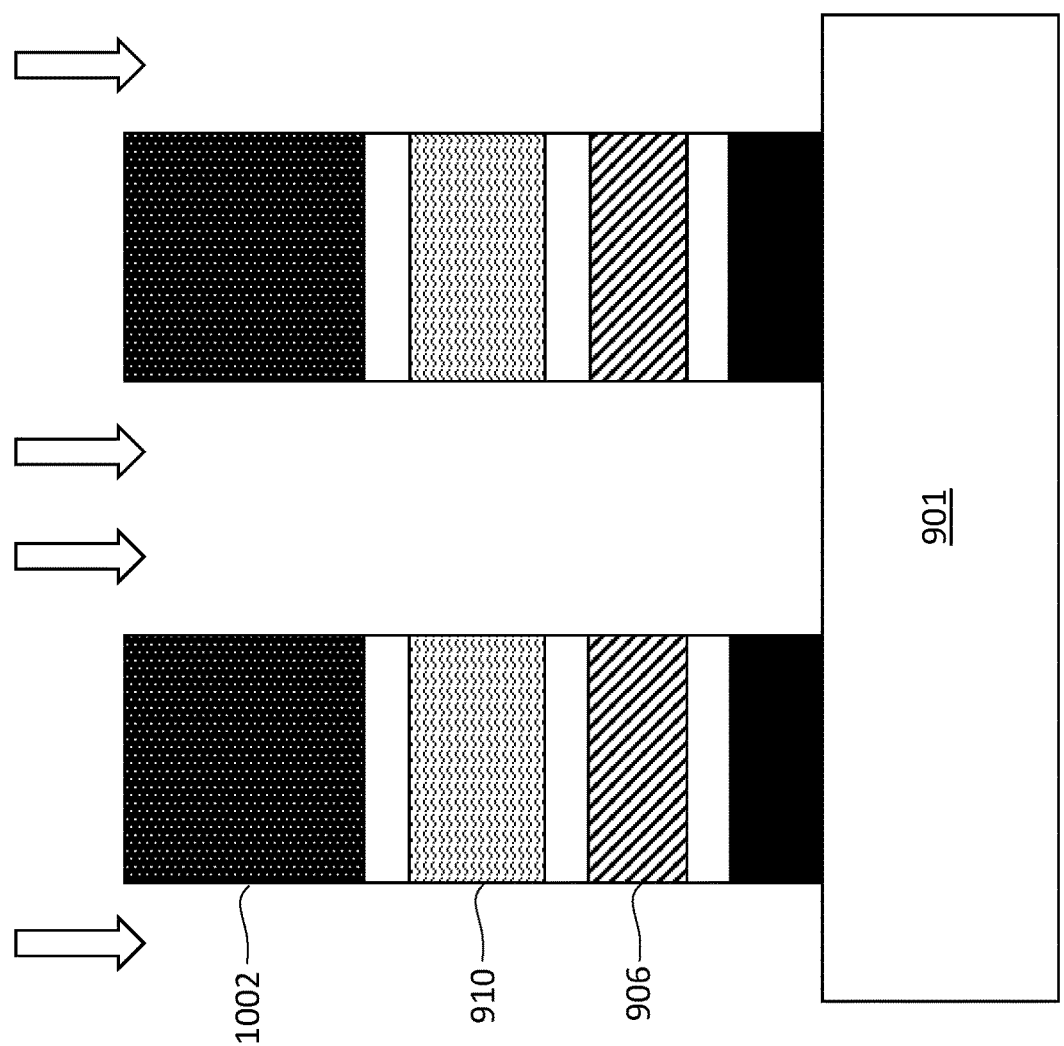
FIG. 10 illustrates a cross-section view of another stage in a fabrication process for a portion of a memory device, in accordance with some embodiments of the present disclosure.

FIG. 10 illustrates an etching process being performed that etches through a thickness of at least a portion of the stack of layers to expose side walls of at least one phase change layer 910 and at least one selector layer 906, according to an embodiment. A mask layer 1002 may be deposited and patterned using standard lithography techniques to expose particular regions to the etching process, as variously shown in FIG. 10. Mask layer 1002 may be, for example, a dielectric material, such as silicon oxide or silicon nitride. In some embodiments, the etch is carried out by a directional (anisotropic) dry etch, although wet etching can be used as well (albeit less directional) or a combination of wet and dry etching, in still other embodiments. Note that the etching process can cause, for instance, rounding of the top corners of mask layer 1002 and/or rounding at the trench bottom, given real-world process limitations, as will be appreciated. The arrows indicate the general direction of a standard anisotropic dry etching process, according to one embodiment.

According to an embodiment, an anisotropic etch is performed using conventional dry etching techniques by placing substrate 901 into a vacuum chamber and introducing various gas chemistries and bias potentials to etch through the various material layers. In some embodiments, the etch process includes more than one etching procedure. For example, a first etch may be performed far enough to expose sidewalls of at least one phase change layer 910, followed by depositing one or more additional films, then performing a second etch through a remainder of the layer stack down to substrate 901. The additional films deposited during the etching process are not shown for clarity but may be provided to protect at least one phase change layer 910 during subsequent etching processes.

Figure 11:
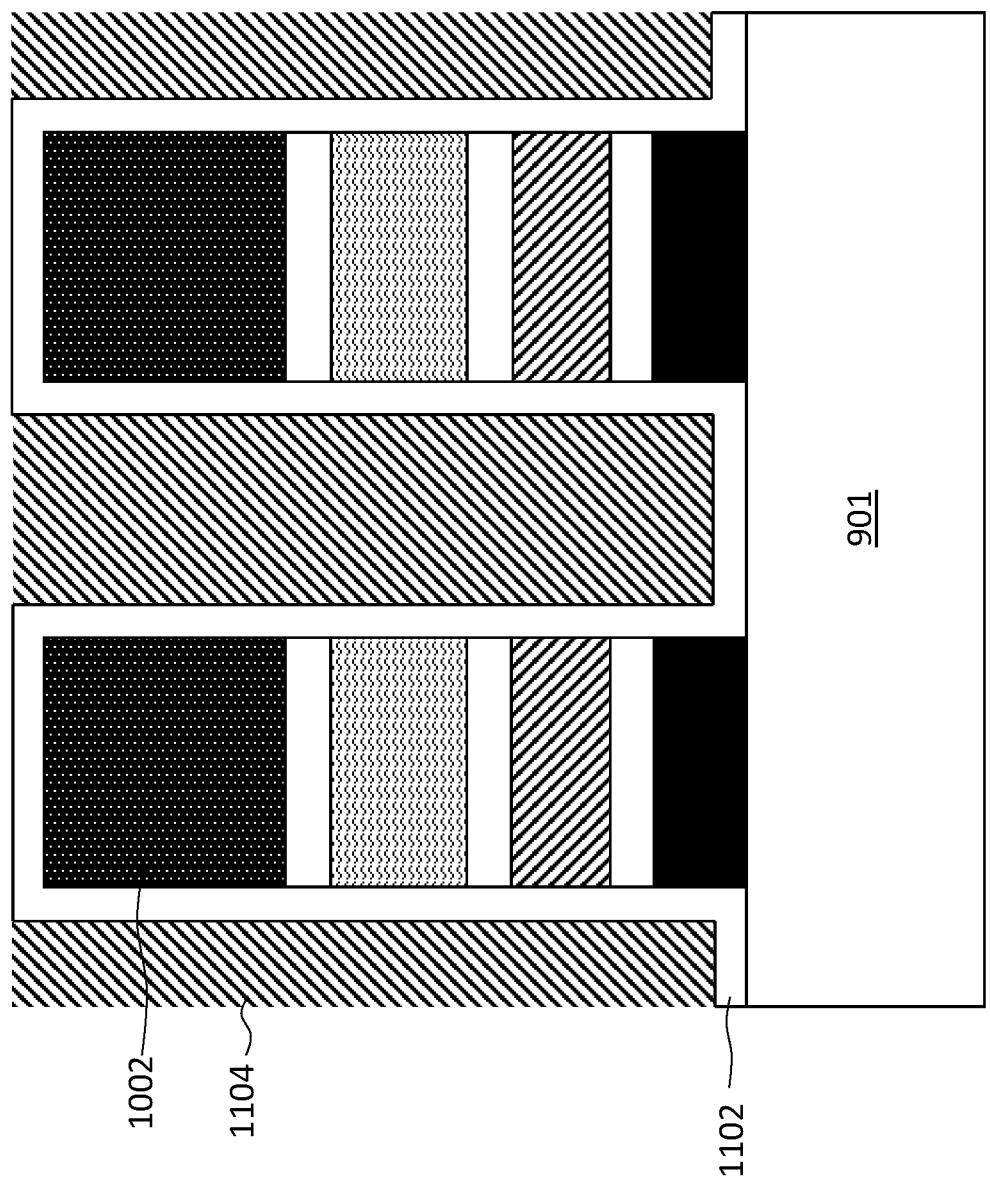
FIG. 11 illustrates a cross-section view of another stage in a fabrication process for a portion of a memory device, in accordance with some embodiments of the present disclosure.

For example, FIG. 11 illustrates the deposition of a liner structure 1102 deposited to protect the various layers of each memory cell, according to some embodiments. The liner structure may include a dielectric material deposited, for example, using a low-temperature plasma enhanced chemical vapor deposition (PECVD) process or a low-temperature plasma enhanced atomic layer deposition (PEALD). The blanket thickness (i.e., thickness measured on a horizontal planar surface, such as the top surface of substrate 901) of liner structure 1102 may be between, for example, about 30 Å and 250 Å, according to some embodiments. The thickness of liner structure 1102 on the sidewalls of the memory cells may be less than the blanket thickness, depending on the conformality of the deposition technique employed. In some embodiments, liner structure 1102 includes more than one deposited dielectric film. The multiple dielectric films can have the same material composition, or different material compositions depending on the application.

A fill dielectric 1104 is also deposited around the various memory cells, according to an embodiment. Fill dielectric 1104 is deposited over liner structure 1102, in this example case. Fill dielectric 1104 may be deposited to fill any remaining area between adjacent memory cells, to generally planarize the structure. In some embodiments, fill dielectric 1104 is silicon oxide and is deposited using a PECVD process.

Figure 12:
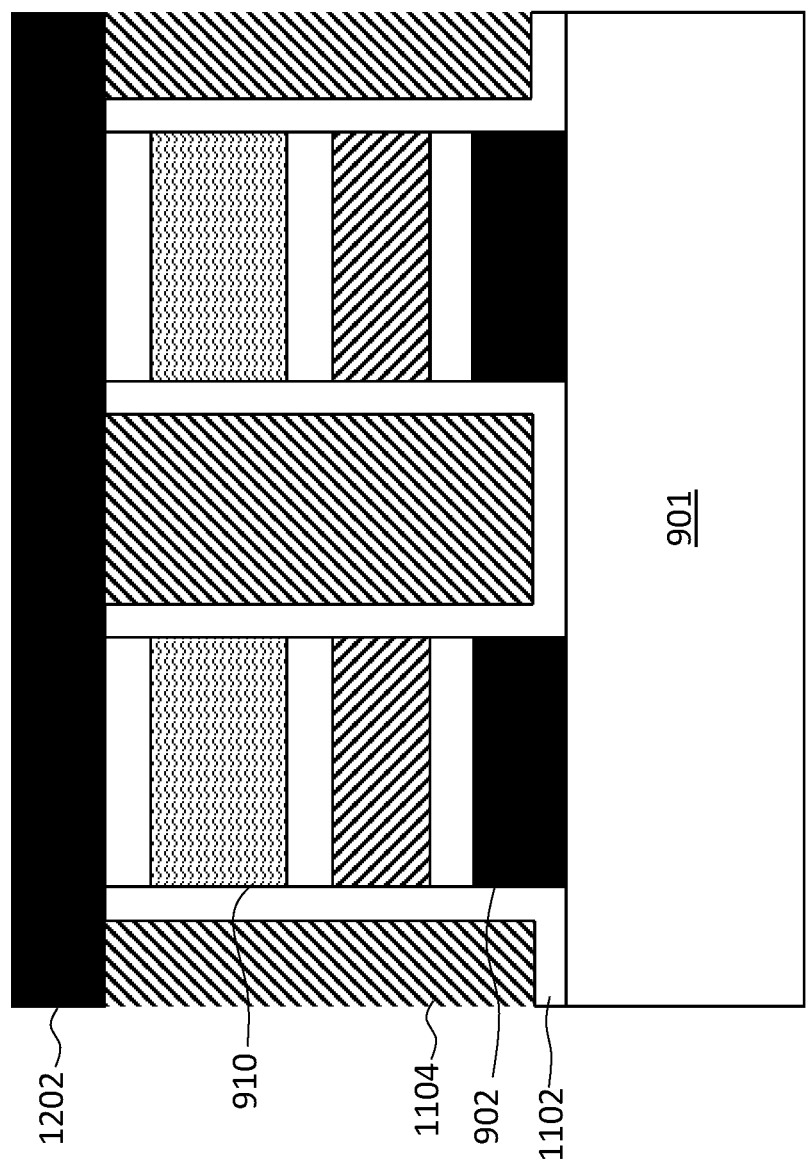
FIG. 12 illustrates a cross-section view of another stage in a fabrication process for a portion of a memory device, in accordance with some embodiments of the present disclosure.

FIG. 12 illustrates the completion of a first set of memory cells, according to some embodiments. After depositing fill dielectric 1104, a top surface of the structure may be planarized using a chemical mechanical polishing (CMP) process. In some embodiments, this CMP process also removes mask layer 1002. In some embodiments, the structure may be planarized down to third electrode layer 912 over one or more phase change layers 910. Following the planarization, a conductive material layer 1202 is deposited over the memory cells. Conductive material layer 1202 may be patterned to form bit lines/word lines that run orthogonal to word lines/bit lines 902. In some embodiments, conductive material layer 1202 is a metal, such as tungsten, silver, aluminum, titanium, cobalt, or an alloy.

Example Electronic Device

Figure 13:
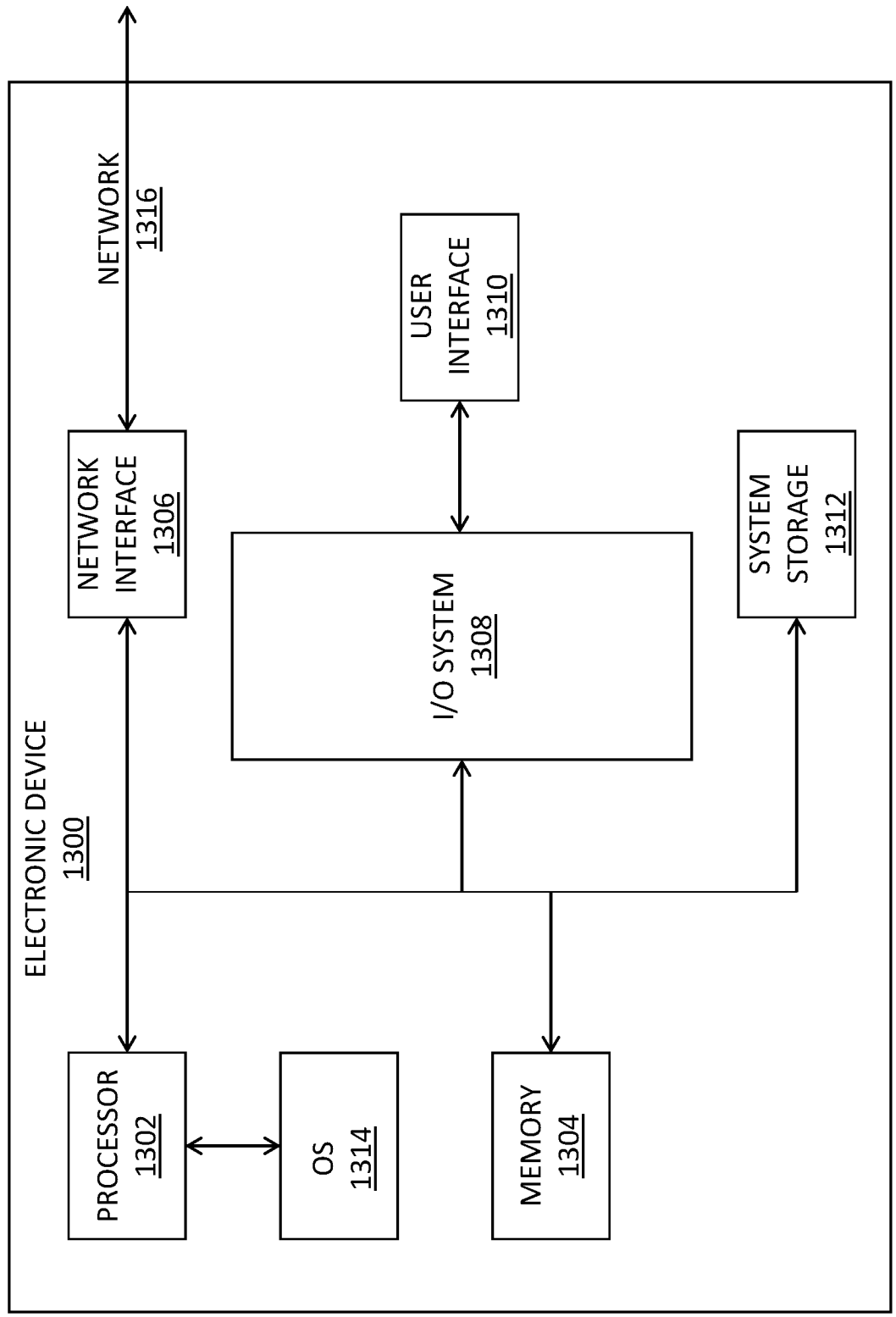
FIG. 13 illustrates an example electronic device that can include one or more of the embodiments of the present disclosure.

FIG. 13 illustrates an example electronic device 1300 that may include one or more memory devices such as the embodiments disclosed herein. In some embodiments, electronic device 1300 may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, imaging device, wearable device, embedded system, and so forth. Any combination of different devices may be used in certain embodiments.

In some embodiments, electronic device 1300 may comprise any combination of a processor 1302, a memory 1304, a network interface 1306, an input/output (I/O) system 1308, a user interface 1310, and a storage system 1312. As can be further seen, a bus and/or interconnect is also provided to allow for communication between the various components listed above and/or other components not shown. Electronic device 1300 can be coupled to a network 1316 through network interface 1306 to allow for communications with other computing devices, platforms, or resources. Other componentry and functionality not reflected in the block diagram of FIG. 13 will be apparent in light of this disclosure, and it will be appreciated that other embodiments are not limited to any particular hardware configuration.

Processor 1302 can be any suitable processor and may include one or more coprocessors or controllers to assist in control and processing operations associated with electronic device 1300. In some embodiments, processor 1302 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core.

Memory 1304 can be implemented using any suitable type of digital storage including, for example, flash memory and/or random access memory (RAM). In some embodiments, memory 1304 may include various layers of memory hierarchy and/or memory caches as are known to those of skill in the art. Memory 1304 may be implemented as a volatile memory device such as, but not limited to, a RAM, dynamic RAM (DRAM), or static RAM (SRAM) device. Storage system 1312 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage system 1312 may comprise technology to increase the storage performance enhanced protection for valuable digital media when multiple hard drives are included. According to some embodiments of the present disclosure, either or both memory 1304 and storage system 1312 includes one or more memory arrays 122 having memory cells 102 fabricated using one or more of the processes discussed herein. According to some embodiments of the present disclosure, either or both memory 1304 and storage system 1312 may be incorporated in a chip package 200 and bonded to a printed circuit board (PCB) along with one or more other devices.

Processor 1302 may be configured to execute an Operating System (OS) 1314 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS), and/or any other executable applications. Processor 1302 may also include onboard cache or memory that can be configured, for instance, with memory array structures as variously provided herein.

Network interface 1306 can be any appropriate network chip or chipset which allows for wired and/or wireless connection between other components of electronic device 1300 and/or network 1316, thereby enabling electronic device 1300 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 1308 may be configured to interface between various I/O devices and other components of electronic device 1300. I/O devices may include, but not be limited to, a user interface 1310. User interface 1310 may include devices (not shown) such as a display element, touchpad, keyboard, mouse, and speaker, etc. I/O system 1308 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 1302 or any chipset of electronic device 1300.

It will be appreciated that in some embodiments, the various components of the electronic device 1300 may be combined or integrated in a system-on-a-chip (SoC) architecture. In some embodiments, the components may be hardware components, firmware components, software components or any suitable combination of hardware, firmware or software.

In various embodiments, electronic device 1300 may be implemented as a wireless system, a wired system, or a combination of both. When implemented as a wireless system, electronic device 1300 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, electronic device 1300 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

Numerous specific details have been set forth herein to provide a thorough understanding of the embodiments. It will be understood in light of this disclosure, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is a memory device that includes an array of memory cells. Each of the memory cells is arranged between a word line and a bit line of the memory device. Each memory cell includes a stack of layers comprising a phase change layer, a selector layer, and an electrode. Each memory cell further includes an interface layer in contact with the electrode. The interface layer comprises one or more of tungsten, silicon, aluminum, oxygen, boron, or nitrogen.

Example 2 includes the subject matter of Example 1, wherein the interface layer has a thickness between about 20 Å and about 50 Å.

Example 3 includes the subject matter of Example 1 or 2, wherein the electrode consists of carbon.

Example 4 includes the subject matter of Example 1 or 2, wherein the electrode comprises carbon and nitrogen.

Example 5 includes the subject matter of any one of Examples 1-4, wherein the electrode is a first electrode that is beneath the selector layer, and the stack of layers further comprises one or both of: a second electrode between the phase change layer and the selector layer; and a third electrode above the phase change layer.

Example 6 includes the subject matter of Example 5, wherein a combined resistance of the first electrode and the interface layer is about 20% higher than a resistance of the second electrode and/or the third electrode.

Example 7 includes the subject matter of Example 5 or 6, wherein one of the first electrode, second electrode, or third electrode has a greater thickness than either of the other two electrodes.

Example 8 includes the subject matter of Example 7, wherein the one of the first electrode, second electrode, or third electrode has a thickness that is up to 50% greater than a thickness of the other two electrodes.

Example 9 includes the subject matter of any one of Examples 5-8, wherein one or more of the first electrode, second electrode, and the third electrode comprises carbon and nitrogen.

Example 10 includes the subject matter of any one of Examples 1-9, wherein the interface layer comprises tungsten, silicon, and nitrogen.

Example 11 is an electronic device comprising a chip package that includes the memory device of any one of Examples 1-10.

Example 12 is a memory device that includes an array of memory cells. Each of the memory cells is arranged between a word line and a bit line of the memory device. Each memory cell includes a stack of layers comprising a phase change layer, a selector layer, and a plurality of electrodes. A first electrode of the plurality of electrodes has a greater thickness than one or more of the other electrodes of the plurality of electrodes.

Example 13 includes the subject matter of Example 12, wherein the first electrode has a thickness that is up to 50% greater than a thickness of the one or more of the other electrodes.

Example 14 includes the subject matter of Example 12 or 13, wherein a resistance of the first electrode is about 5% higher than a resistance of the one or more of the other electrodes.

Example 15 includes the subject matter of any one of Examples 12-14, wherein the first electrode consists of carbon.

Example 16 includes the subject matter of any one of Examples 12-15, wherein one or more of the plurality of electrodes comprises carbon and nitrogen.

Example 17 includes the subject matter of any one of Examples 12-16, wherein the first electrode is beneath the selector layer, and the plurality of electrodes further comprises one or both of: a second electrode between the phase change layer and the selector layer; and a third electrode above the phase change layer.

Example 18 includes the subject matter of any one of Examples 12-17, wherein the stack of layers further comprises an interface layer in contact with one of the plurality of electrodes, the interface layer comprising one or more of tungsten, silicon, aluminum, oxygen, boron, or nitrogen.

Example 19 includes the subject matter of Example 18, wherein the interface layer is in contact with the first electrode.

Example 20 is an electronic device comprising a chip package that includes the memory device of any one of Examples 12-19.

Example 21 is a memory device that includes an array of memory cells. Each of the memory cells is arranged between a word line and a bit line of the memory device. Each memory cell includes a stack of layers comprising a phase change layer, a selector layer, and a plurality of electrodes. A first electrode of the plurality of electrodes has a greater resistivity than one or more of the other electrodes of the plurality of electrodes.

Example 22 includes the subject matter of Example 21, wherein one of the plurality of electrodes has a greater thickness than one or more of the other electrodes.

Example 23 includes the subject matter of Example 22, wherein the one of the plurality of electrodes has a thickness that is up to 50% greater than a thickness of the one or more of the other electrodes.

Example 24 includes the subject matter of any one of Examples 21-23, wherein the first electrode comprises carbon and nitrogen.

Example 25 includes the subject matter of any one of Examples 21-24, wherein the first electrode is beneath the selector layer, and the plurality of electrodes further comprises one or both of: a second electrode between the phase change layer and the selector layer; and a third electrode above the phase change layer.

Example 26 includes the subject matter of any one of Examples 21-25, wherein the stack of layers further comprises an interface layer in contact with one of the plurality of electrodes, the interface layer comprising one or more of tungsten, silicon, aluminum, oxygen, boron, or nitrogen.

Example 27 includes the subject matter of Example 26, wherein the interface layer is in contact with the first electrode.

Example 28 is an electronic device comprising a chip package that includes the memory device of any one of Examples 21-27.

What is claimed is:

1. A memory device, comprising:
an array of memory cells, each memory cell arranged between a word line and a bit line of the memory device, each memory cell to include:
a stack of layers to include a phase change layer, a selector layer, a first electrode that is beneath the selector layer, and one or both of:
a second electrode between the phase change layer and the selector layer; and
a third electrode above the phase change layer; and
an interface layer in direct contact with the first electrode, the interface layer comprising one or more of tungsten, silicon, aluminum, oxygen, boron, or nitrogen, wherein a combined resistance of the first electrode and the interface layer is about 20% higher than a resistance of the second electrode and/or the third electrode.

2. The memory device of claim 1, wherein the interface layer has a thickness between about 20 Å and about 50 Å.

3. The memory device of claim 1, wherein the first electrode comprises carbon and nitrogen.

4. The memory device of claim 1, wherein the interface layer comprises tungsten, silicon, and nitrogen.

5. An electronic device comprising a chip package that includes the memory device of claim 1.

* * * * *